United States Patent [19]

Ahmad

[11] Patent Number: 5,759,875
[45] Date of Patent: Jun. 2, 1998

[54] REDUCED FILLER PARTICLE SIZE ENCAPSULANT FOR REDUCTION IN DIE SURFACE DAMAGE IN LOC PACKAGES AND METHOD OF USE

[75] Inventor: Syed Sajid Ahmad, Boise, Id.

[73] Assignee: Micron Technology, Inc., Boise, Id.

[21] Appl. No.: 725,451

[22] Filed: Oct. 4, 1996

[51] Int. Cl.⁶ .................................................. H01L 21/56
[52] U.S. Cl. ........................................... 438/127; 438/124
[58] Field of Search .................................. 438/121–124, 438/127; 257/787–795

[56] References Cited

U.S. PATENT DOCUMENTS

| | | |
|---|---|---|
| 4,862,245 | 8/1989 | Pashby et al. . |
| 4,984,059 | 1/1991 | Kubota et al. . |
| 5,184,208 | 2/1993 | Sakuta et al. . |
| 5,252,853 | 10/1993 | Michii . |
| 5,286,679 | 2/1994 | Farnworth et al. . |
| 5,304,842 | 4/1994 | Farnworth et al. . |
| 5,461,255 | 10/1995 | Chan et al. . |
| 5,492,863 | 2/1996 | Higgins, III ........................ 437/183 |
| 5,698,904 | 12/1997 | Tsuji ................................. 257/795 |

*Primary Examiner*—John Niebling
*Assistant Examiner*—Kevin F. Turner
*Attorney, Agent, or Firm*—Trask Britt & Rossa

[57] ABSTRACT

A packaged LOC die assembly is disclosed including a die dielectrically adhered to the underside of a lead frame. Reduced-size filler particles are used in the encapsulant with the maximum allowable diameter of any particle depending upon the gap width between the lead frame and the die surface. Specifically, the maximum particle diameter is limited such that the ratio of maximum particle diameter to gap width is 0.95 or less, or preferably approximately 0.75. The reduced-size particles do not lodge between the leads and the active surface of the die during transfer molding of the encapsulant, thus, reducing point stresses on the active surface of the die by the filler particles.

20 Claims, 5 Drawing Sheets

REDUCED FILLER PARTICLE SIZE ENCAPSULANT FOR REDUCTION IN DIE SURFACE DAMAGE IN LOC PACKAGES AND METHOD OF USE

BACKGROUND OF THE INVENTION

1. Field of the Invention

The present invention relates to a "leads over chip" (LOC) semiconductor die assembly, and, more particularly, to a method and apparatus for preventing the lodging of stress-inducing filler particles present in plastic encapsulants between the underside of the lead frame leads and the active surface of the die.

2. State of the Art

The use of LOC semiconductor die assemblies has become relatively common in the industry in recent years. This style or configuration of semiconductor device replaces a "traditional" lead frame with a central, integral support (commonly called a die-attach tab, paddle, or island) to which the back surface of a semiconductor die is secured. An LOC has a lead frame arrangement wherein the integral die-attach support is eliminated and at least some of the leads extend over the active surface of the die. The die is adhered to the leads with an adhesive, preferably a dielectric layer, disposed between the underside of each lead extension and the die. Early examples of LOC assemblies are illustrated in U.S. Pat. Nos. 4,862,245 to Pashby et al. and 4,984,059 to Kubota et al. More recent examples of the implementation of LOC technology are disclosed in U.S. Pat. Nos. 5,184,208; 5,252,853; 5,286,679; 5,304,842; and 5,461,255. Also, some LOC assemblies employ large quantities or horizontal cross-sectional areas of adhesive to enhance physical support of the die for handling.

Traditional lead frame die assemblies using an integral die-attach support have the inner ends of the lead frame leads placed in close lateral proximity to the periphery of the active die surface where the bond pads are located and connected to the leads with wire bonds. LOC die assemblies, by their extension of inner lead ends over the die, permit physical support of the die from the leads themselves and more diverse (including centralized) placement of the bond pads on the active surface. One of the main advantages of LOC die assemblies is that the LOC configuration allows a larger die to be housed in a package of a given size than possible using a traditional assembly. Routing leads over the die in an LOC assembly requires less space around the die periphery to accommodate leads than in a conventional design, where leads ends are in close lateral proximity to the periphery of the active die surface. LOC leads may also operate as heat transfer conduits away from the die. However, use of LOC die assemblies in combination with plastic packaging of the LOC die assembly, as known in the art, has demonstrated shortcomings as presently practiced in the art.

The most common manner of forming a plastic package about a die assembly is molding, and specifically transfer molding. In the transfer molding process (and with specific reference to LOC die assemblies), a semiconductor die is suspended by its active surface from the underside of inner lead extensions of a lead frame (typically Cu or Alloy 42) by a tape, screen print or spin-on dielectric adhesive layer. The bond pads of the die and the inner lead ends of the frame are then electrically connected by wire bonds (typically Au, although Al and other metal alloy wires have also been employed) by means known in the art. The resulting LOC die assembly, which may comprise the framework of a dual-in-line package (DIP), zig-zag in-line package (ZIP), small outline j-lead package (SOJ), quad flat pack (QFP), plastic leaded chip carrier (PLCC), surface mount device (SMD) or other plastic package configuration known in the art, is placed in a mold cavity and encapsulated in an encapsulant which includes a thermosetting polymer which, when heated, reacts irreversibly to form a highly cross-linked matrix no longer capable of being remelted.

The term "transfer" molding is descriptive of the transfer molding process as the molding compound, once melted, is transferred under pressure to a plurality of remotely-located mold cavities containing die assemblies to be encapsulated. FIG. 2 is a flow chart of a typical process sequence for plastic package molding. It should be noted that the solder dip/plate operation has been shown as one step for brevity; normally plating would occur prior to trim and form.

FIGS. 3A and 3B show pre-molding and post-molding positions of encapsulant during a transfer molding operation using a typical mold apparatus comprising upper mold half 10 and lower mold half 12, each mold half including a platen 14 and 16, respectively, with its associated chase 18 and 20, respectively. Heating elements 22 are employed in the platens to maintain an elevated and relatively uniform temperature of the mold during the molding operation. FIG. 4 shows a top view of one side of the transfer mold apparatus of FIGS. 3A and 3B. In the transfer mold apparatus shown, the encapsulant flows into each mold cavity 44 through the short end thereof.

In operation, a heated pellet of resin mold compound 30 is disposed beneath a ram or plunger 32 in a pot 34. The plunger 32 descends, melting the pellet 30 and forcing the melted encapsulant down through a sprue 36 and into a primary runner 38, from which it travels to transversely-oriented secondary runners 40 and across gates 42 into and through the mold cavities 44 through the short side thereof flowing across the die assemblies 100, wherein the die assemblies 100 comprising dies 102 with attached lead frames 104 are disposed (usually in strips so that a strip of six lead frames, for example, would be cut and placed in and across the six cavities 44 shown in FIG. 4). Air in the primary runners 38, the secondary runners 40, and mold cavities 44 is vented to the atmosphere through vents 46 and 48. At the end of the molding operation, the encapsulant is "packed" by application of a higher pressure to eliminate voids and reduce non-uniformities of the encapsulant in the mold cavities 44. After molding, the encapsulated die assemblies are ejected from the cavities 44 by ejector pins 50, after which they are post-cured at an elevated temperature to complete cross-linking of the resin within the encapsulant, followed by other operations as known in the art and set forth in FIG. 2 by way of example. It will be appreciated that other transfer molding apparatus configurations, as well as variations in the details of the described method, are known in the art. However, none of such are pertinent to the invention, and so will not be discussed herein.

The encapsulant generally comprises three major components: epoxy resin, hardener (including accelerators), and filler material. Other additives such as flame retardants, mold release agents and colorants are also employed in relatively small amounts. While many variations of the three major components are known in the art, the focus of the present invention resides in the filler materials employed and their effects on the active die surface.

Filler materials are usually a form of fused silica, although other materials such as calcium carbonates, calcium silicates, talc, mica and clays have been employed. Powdered fused quartz is currently the primary filler used in encapsulants. Generally, rather than consisting of particles of a single, uniform size and shape, filler material includes a wide range of particle sizes and shapes, which can be controlled to some extent by suppliers to meet the specialized needs of an end user. Filler material may consist of spheres, non-uniform flakes, a mixture of the two, or yet other shapes. Fillers provide a number of advantages in comparison to unfilled encapsulants. For example, fillers reinforce the encapsulant and thus provide additional package strength, enhance thermal conductivity of the package, provide enhanced resistance to thermal shock, and greatly reduce the cost of the encapsulant in comparison to its unfilled state. Fillers also beneficially reduce the coefficient of thermal expansion (CTE) of the composite material by about fifty percent in comparison to the unfilled encapsulant, resulting in a CTE much closer to that of the silicon or gallium arsenide die. The CTE obtained will depend upon the amount and kind of filler used. Filler materials, however, may also present some recognized disadvantages, including increasing the stiffness of the plastic package.

Encapsulant flow in the mold cavities 44 is demonstrably non-uniform. The presence of the die assembly 100 comprising a die 102 with lead frame 104 disposed across the mid-section of a cavity 44 splits the viscous encapsulant flow front 106 into upper 108 and lower 110 components, as shown in FIGS. 5A and 5B. Further, the presence of the (relatively) large die 102 with its relatively lower temperature in the middle of a cavity 44 permits the flow front 106 on each side of the die 102 to advance ahead of the front with passes over and under the die 102. FIGS. 5A and 5B also show two mold cavity encapsulant flow scenarios where, respectively, the lower flow front 110 and the upper flow front 108 lead the overall encapsulant flow front 106 in the cavity 44 containing the die assembly 100. FIG. 5C depicts the advance of a flow front 106 from above, before and after a die 102 is encountered, the flow being depicted as time-separated instantaneous flow fronts 106a, 106b, 106c, 106d, 106e and 106f.

One disadvantage discovered by the inventor herein is damage to the active die surface resulting from encapsulant filler particles becoming lodged or wedged between the underside of the lead extensions and the active die surface. The particles become lodged during transfer molding of the plastic package about the die and the inner lead ends of the LOC die assembly. The non-uniform flow characteristics of the viscous encapsulant flow, as described above, may cause (in addition to other phenomena, such as wire sweep, which are not relevant to the invention) particles to be more forcefully driven between the leads and the die and wedged or jammed in place in low-clearance areas. (FIG. 1). With typical lead and adhesive LOC arrangements, the relative inflexibility of the tightly-constrained (adhered) lead ends maintains the point stresses of the particles trapped under the leads. These residual stresses are carried forward in the fabrication process to post-cure and beyond. The particles may then damage the die surface or conductive elements thereon or immediately thereunder when the package is further stressed (mechanically, thermally, or electrically) during post-encapsulation handling and testing. Such damage includes cracking or puncture of the protective coating on the die by a filler particle and subsequent damage to or short circuiting of the circuitry beneath or on the active die surface. While it is possible to employ a lower volume of filler in the encapsulant to reduce the potential for filler particle lodging or wedging, a reduction in filler volume raises costs of the encapsulant, which increases the cost of the semiconductor device.

A reduction in filler also affects the encapsulant's physical properties which, in turn, affect package integrity.

To graphically illustrate the above description of particle lodging, FIG. 6A depicts a prior art packaged LOC assembly wherein a single lead 112 extends over a die 102, with a segment of dielectric adhesive 114, in this instance a piece of Kapton™ polyimide tape, adhered to both the lead 112 and the active surface 116 of the die. As better illustrated in FIG. 6B, filler particle 130, which is part of the packaging material 123, is lodged between lead 112 and die surface 116. It is clear that the lead end 122 is tightly constrained from movement by the inflexibility of the attachment of the lead end 122 to the die 102 by the adhesive 114. Moreover, the relative closeness of the lead 112 to the active surface 116 and the inability of the lead 112 to flex or relax to reduce stress occasioned by the presence of the filler particle 130 may continue even after the encapsulant has reached hydrostatic balance such that the filler particle 130 may become tightly lodged between the lead 112 and the active surface 116.

Ongoing advances in design and manufacturing technology provide increasingly thinner conductive, semiconductive and dielectric layers in state-of-the-art semiconductor dice. The width and pitch of conductors serving various purposes on the active surface of the die are likewise being continually reduced. The resulting die structures, while robust and reliable for their intended uses, must nonetheless become more stress-susceptible due to the minimal strength provided by the minute widths, depths and spacings of their constituent elements. The integrity of active surface die coats, such as silicon dioxide, doped silicon dioxides such as phosphorous silicate glass (PSG) or borophosphorous silicate glass (BPSG), or silicon nitride, may thus be compromised by point stresses applied by filler particles, the result being unanticipated shortening of device life if not immediate, detectable damage or alteration of performance characteristics.

The aforementioned U.S. Pat. No. 4,984,059 to Kubota et al. does incidentally disclose several exemplary LOC arrangements which appear to greatly space the leads over the chip or which do not appear to provide significant areas for filler particle lodging. However, such structures may create fabrication, lead spacing and positioning difficulties.

To the inventor's knowledge, those of ordinary skill in the art have failed to recognize this particular stress phenomenon attendant to transfer molding and the use of filled encapsulants, nor has the current state of the art provided an encapsulant filler which beneficially accommodates this phenomenon.

SUMMARY

The present invention provides a packaged, lead-supported die assembly for an LOC arrangement that substantially reduces the stress from encapsulant filler particles positioned between the leads and the active die surface. Reduced-size filler particles are used in the encapsulant with the maximum allowable diameter of any particle depending upon the gap width between the lead frame and the die surface. Specifically, the maximum particle diameter is limited such that the ratio of maximum particle diameter to gap width is 0.95 or less, or preferably approximately 0.75.

To the inventor's knowledge, no filler material is currently sold commercially with a small enough maximum particle diameter such that a 0.95 ratio may be obtained in assemblies featuring a gap width of 110 μm or less. Similarly, no filler material is sold commercially that allows a 0.75 ratio to be obtained in assemblies featuring a gap width of 140 μm or less. Thus, special effort is required to obtain a 0.95 ratio or less for an assembly with a standard 100 μm gap width. The inventor has obtained a reduced-size filler material by removal of the unwanted large particles normally left in the currently available filler materials. Furthermore, spherical particles are more desirable than other shapes since their lack of sharp edges decrease the likelihood of damage to the die surface, but the present invention operates regardless of particle shape.

Another way to obtain the desired ratio is simply to increase the gap width by using thicker tape, however, this increases the size of the assembly and increases the cost of the tape, both undesirable consequences. By instead using reduced-size particles, the present invention allows the manufacture of less costly narrow gap assemblies with only minor process changes and without the accompanying higher failure rate experienced with prior art filler particles.

When maintaining about a 0.95 ratio or less, the largest particles are simply too small to lodge between the lead frame and die surface and, thus, cannot induce stress in the assembly. Any stacking of filler particles, causing stress in the connection between the lead and the die, is also less likely to occur, particularly if a 0.75 ratio is maintained in accordance with the present invention. By maintaining a ratio of 0.75, the size similarity between a 0.75 ratio particle (the maximum allowable size) and a greater than 0.25 ratio particle (the corresponding size required to induce stress) is sufficiently close that the particles will slip, relieving the stress from stacking, rather than remain stacked. The resulting reduced likelihood of stacking will produce an immediate reduction in the residual stress experienced by the active die surface. This lessened residual stress is carried forward in the encapsulated package after cure, permitting the package to better withstand the stresses of postencapsulation handling and testing, including the elevated potentials and temperatures experienced during burn-in, without adverse effects. Also, the smaller particle, having a greater than 0.25 ratio, possesses sufficient size such that it will not readily puncture the die coat in the unlikely event that slippage does not occur.

The LOC apparatus of the present invention comprises a lead frame to which the active surface of a die is adhered by an LOC tape, permitting the lead frame to physically support the die during pre-encapsulation handling and processing such as wire bonding. During encapsulation, the intrusion of reduced-size filler particles between the inner lead ends and the active surface of the die will occur, but the particles will be beneficially accommodated.

DETAILED DESCRIPTION OF THE ILLUSTRATED EMBODIMENT

Figure 1:
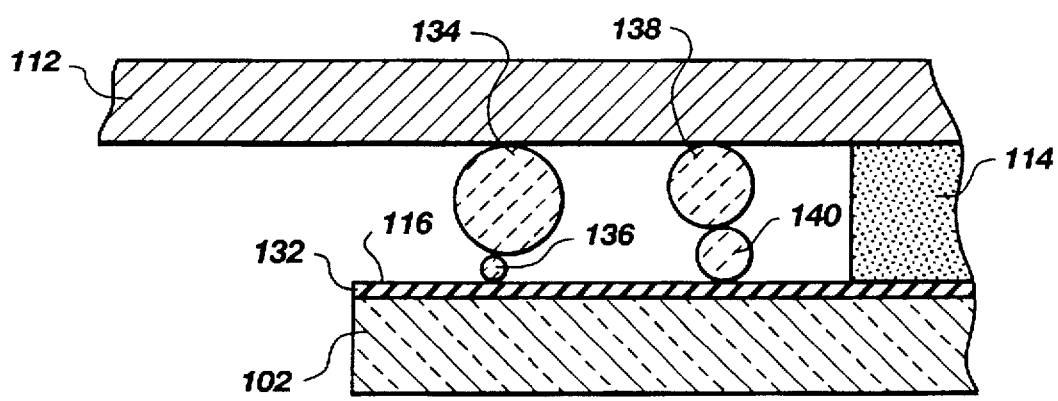
FIG. 1 shows a cross-sectional side view of a packaged SOJ semiconductor device.
Figure 2:
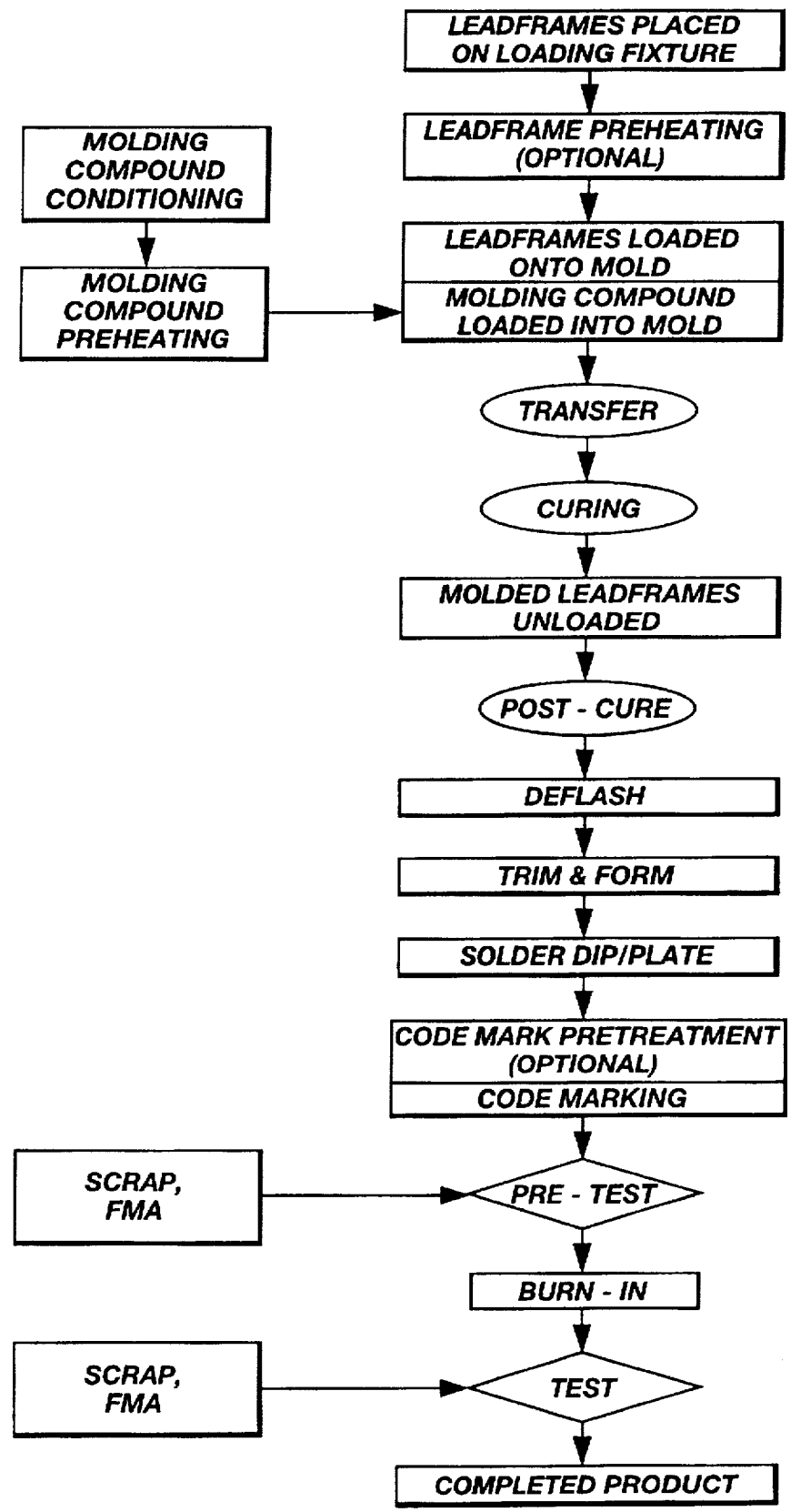
FIG. 2 is a flow chart of an exemplary process sequence for plastic package molding.
Figure 3A:
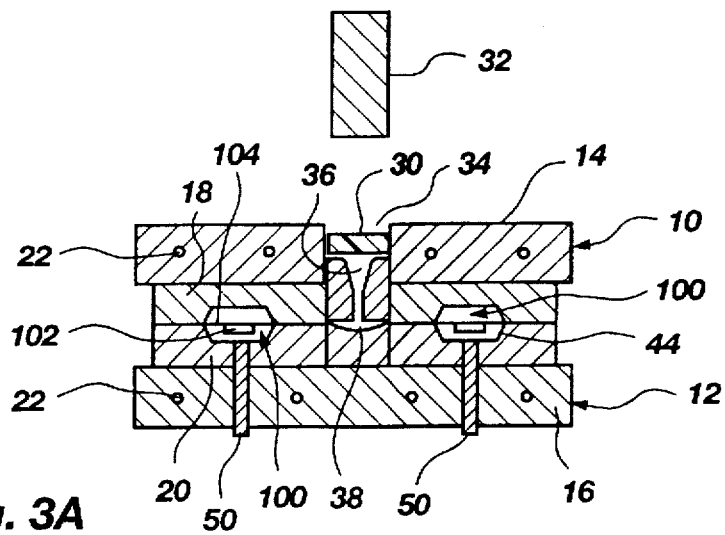
FIGS. 3A and 3B are cross-sectional side views of a typical transfer molding, showing pre-molding and post-molding encapsulant positions.
Figure 3B:
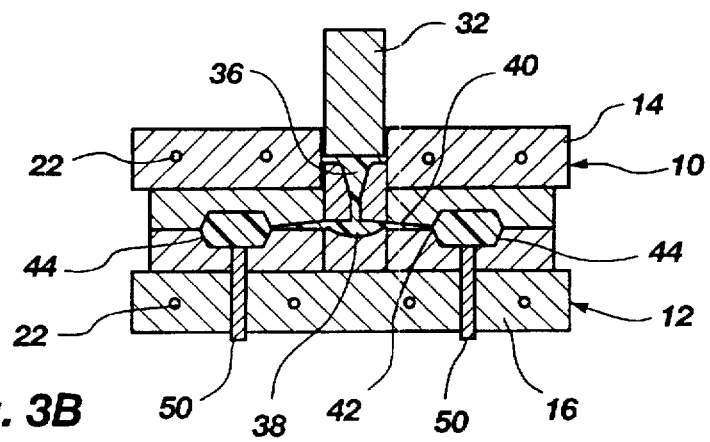
Figure 4:
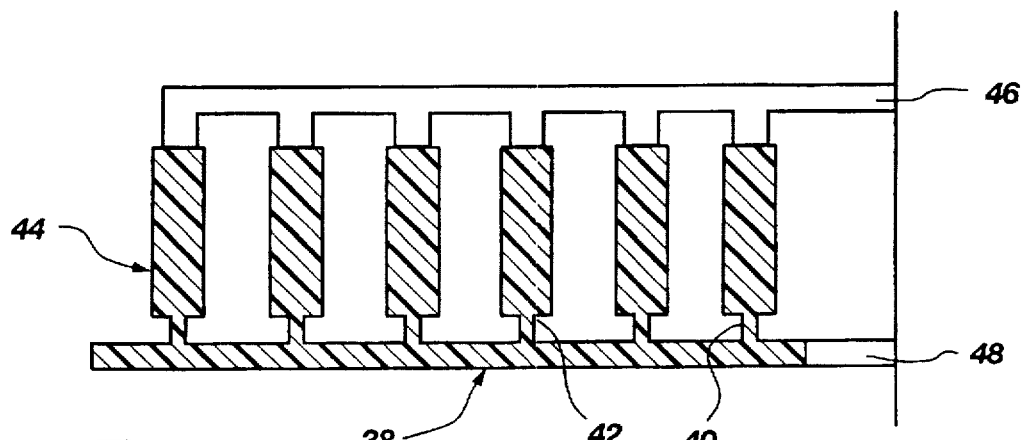
FIG. 4 shows a top schematic view of one side of a transfer mold of FIGS. 3A and 3B, depicting encapsulant flow and venting of the primary mold runner and the mold cavities wherein the die assemblies are contained.
Figure 5A:
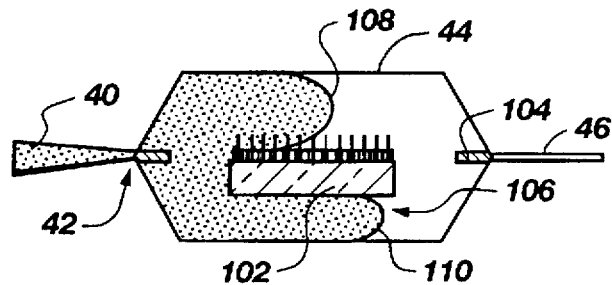
FIGS. 5A, 5B and 5C show cross-sections of encapsulant flow scenarios for a mold cavity.
Figure 5B:
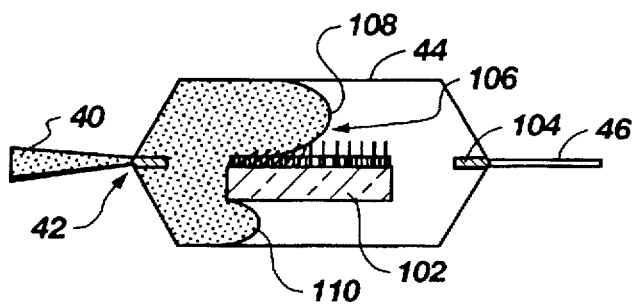
Figure 5C:
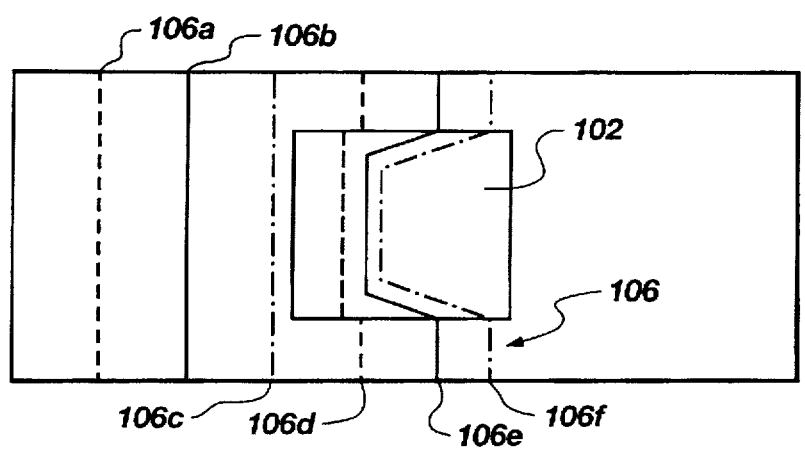
Figure 6A:
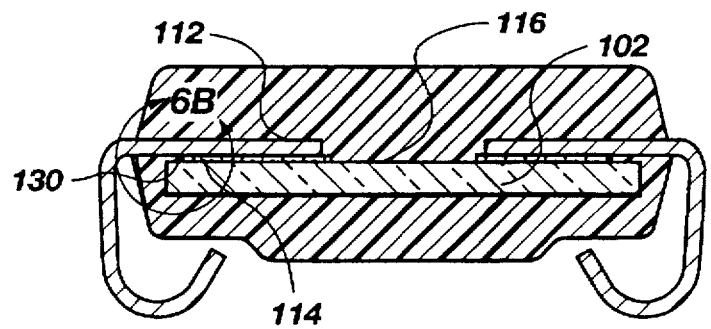
FIGS. 6A and 6B show cross-sectional side views of packaged SOJ semiconductor devices.
Figure 6B:
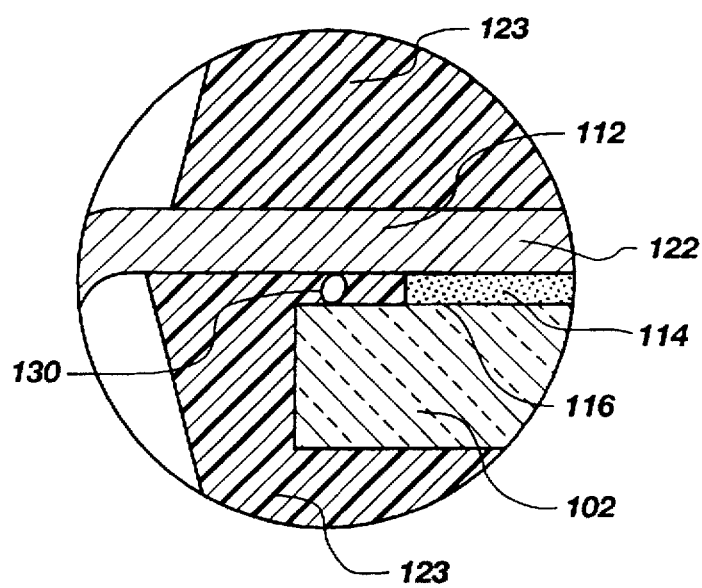

FIG. 1 depicts the lodging of multiple filler particles between a lead 112 and a die surface 116. In addition to cracks or damage to die coat 132 associated with the lodging of a single filler particle, perforation can also readily occur when a single large particle 134 presses a small particle 136 against the die coat 132. When the large particle 134 is of sufficiently greater diameter than the small particle 136 it is unlikely they will slip past one another to relieve stress. Conversely, when two particles of sufficiently similar size 138, 140 are stacked together during transfer molding, slippage will likely occur to relieve stress and no damage to the die coat will occur. The filler particles may become lodged in position due to detrimental encapsulant flow patterns in the mold cavity during encapsulation. However, provided the particles are of sufficiently similar size, they may also settle into a nonstressful position once the flow pattern recedes.

By limiting the ratio of maximum particle diameter to gap width to 0.75, the present invention clearly prevents any stress inducing lodging of single filler particles. No single particle will exist in the encapsulant sufficiently large enough to create residual stress in the packaging. Additionally, the present invention prevents any stress inducing lodging of stacked filler particles. In a preferred ratio of 0.75, the size similarity between a 0.75 ratio particle (the maximum allowable size) and a greater than 0.25 ratio particle (the corresponding size required to induce stress) is sufficiently close that slippage will likely occur to relieve the stress. Further, though unlikely that the particles will remain stacked, the smaller particle nevertheless possesses sufficient size such that it will not readily puncture the die coat.

One embodiment of the invention comprises an assembly having a gap width between the lead frame and active die surface of 100 μm and a specially modified Hitachi 9200 filler material. As normally sold, the Hitachi 9200 contains a maximum particle diameter of 105 μm, however, extra sieving of the material will produce filler material with a 75 μm maximum particle diameter. The additional sieving only removes approximately 5% of the original particles so the effect on the filler material's properties is minimal. While it might be thought to be desirable to use as small of particles as possible, too much decrease in particle size will affect the viscosity of the encapsulant and, thus, might require reformulation. One advantage of this embodiment of the invention is that a small change in current filler materials will yield a substantial decrease in failure rate of LOC assemblies without requiring related process changes. Another consideration indicating moderation in the reduction of filler particle size is the particle size reduction's effect on viscosity. It is desirable to maintain the conventional volume percent of filler material (approximately 90%). However, too much decrease in the size of particles will yield a material with substantially greater surface area that the epoxy resin must coat and, thus, will increase viscosity of the encapsulant. While the desired viscosity could be obtained by subsequently decreasing the volume percent of filler, that will result in an increased volume percent of polymer and corresponding increased cost of the LOC assembly. Thus, it is apparent that the cost saving of reduced LOC failure must be balanced with the cost increase of reformulation or process changes that may result from use of reduced-size filler material. While the invention comprises limiting the ratio of maximum particle diameter to gap width to 0.95 or less, or preferably approximately 0.75, the combination of particular fillers, polymers, and gap widths may yield a different preferable ratio less then 0.95, but nevertheless encompassed by the present invention.

While the invention has thus far been described in terms of reducing the incidence of die coat damage due to filler particles, it should also be recognized that the present invention reduces the tendency toward formation of voids by promoting flow of the encapsulant over, under and around the leads and over the die surface. It is believed that improved PRT (Preconditioned Reflow Test, also termed a "popcorn" test by virtue of its detrimental effect on substandard package integrity) performance, indicative of reduced levels of moisture in the cured encapsulant, will be realized.

The present invention has been disclosed in terms of certain preferred embodiments as illustrated and described herein. However, those of ordinary skill in the art will recognize and appreciate that it is not so limited, and that many additions, deletions and modifications to, and combinations of, the disclosed embodiments may be effected without departing from the scope of the invention as hereinafter claimed. For example, the methods used to produce reduced-size particles may include any known or contemplated method in the art. Multi-layer LOC lead frames such as a two-frame LOC assembly (see above-referenced U.S. Pat. No. 5,461,255) may be adapted to the present invention. Further, the invention is not limited to a particular arrangement of leads, or to a particular lead cross-section or configuration. Finally, the term "LOC" is intended in its broadest sense to encompass any die-and-lead arrangement wherein leads extend across the active surface of the die, such as an inverted LOC arrangement.

What is claimed is:

1. A packaged semiconductor die assembly, comprising:
    a semiconductor die having an active surface;
    a lead frame having a plurality of lead members, at least one of said plurality of lead members having a lead end portion connected to a portion of said lead frame and having a free end portion extending across a portion of said semiconductor die active surface, defining a predetermined gap width between the free end portion and said active surface; and
    an encapsulant including a particulate filler material with substantially only particles having a maximum particle diameter providing a ratio of the maximum particle diameter to said gap width of about 0.95 or less.

2. The die assembly of claim 1, wherein said ratio of said maximum particle diameter to said gap width is approximately 0.75.

3. The die assembly of claim 1, wherein said ratio of said maximum particle diameter to said gap width is less than 0.75.

4. The die assembly of claim 1, wherein said filler material possesses a substantially spherical shape.

5. The die assembly of claim 1, wherein said encapsulant includes a particulate filler material with substantially only particles having a maximum particle diameter providing a ratio of the maximum particle diameter to said gap width of about 0.75 or less and having a minimum particle diameter providing a ratio of the minimum particle diameter to said gap width of about 0.25 or greater.

6. A method of assembling and packaging a semiconductor die to a lead frame, said method comprising the steps of:
    providing a semiconductor die having an active surface;
    attaching to said active surface a lead frame having a plurality of lead members, at least one of said plurality of lead members having a lead end portion connected to a portion of said lead frame and having a free end portion extending across a portion of said semiconductor die active surface, defining a predetermined gap width between the free end portion and said active surface; and
    encapsulating said lead frame and said die at least partially in an encapsulant including a particulate filler material with substantially only particles having a maximum particle diameter providing a ratio of the maximum particle diameter to said gap width of about 0.95 or less.

7. The method of claim 6, wherein said ratio of said maximum particle diameter to said gap width is approximately 0.75.

8. The method of claim 6, wherein said ratio of said maximum particle diameter to said gap width is less than 0.75.

9. The method of claim 6, wherein said filler material possesses a substantially spherical shape.

10. The method of claim 6, wherein said encapsulant includes a particulate filler material with substantially only particles having a maximum particle diameter providing a ratio of the maximum particle diameter to said gap width of about 0.75 or less and having a minimum particle diameter providing a ratio of the minimum particle diameter to said gap width of about 0.25 or greater.

11. A packaged semiconductor die assembly, formed by a process comprising:
    providing a semiconductor die having an active surface;
    attaching to said active surface a lead frame having a plurality of lead members, at least one of said plurality of lead members having a lead end portion connected to a portion of said lead frame and having a free end portion extending across a portion of said semiconductor die active surface, defining a predetermined gap width between the free end portion and said active surface; and
    encapsulating said lead frame and said die at least partially in an encapsulant including a particulate filler m aterial with substantially only particles having a maximum particle diameter providing a ratio of the maximum particle diameter to said gap width of about 0.95 or less.

12. The die assembly of claim 11, wherein said ratio of said maximum p article diameter to said gap width is approximately 0.75.

13. The die assembly of claim 11, wherein said ratio of said maximum particle diameter to said gap width is less than 0.75.

14. The die assembly of claim 11, wherein said filler material possesses a substantially spherical shape.

15. The die assembly of claim 11, wherein said encapsulant includes a particulate filler material with substantially only particles having a maximum particle diameter providing a ratio of the maximum particle diameter to said gap width of about 0.75 or less and having a minimum particle diameter providing a ratio of the minimum particle diameter to said gap width of about 0.25 or greater.

16. A method of designing a semiconductor die assembly, said method comprising the steps of:
    selecting a die assembly including a semiconductor die having an active surface and a lead frame having a plurality of lead members, at least one of said plurality of lead members having a lead end portion connected to a portion of said lead frame and a free end portion extending across a portion of said semiconductor die active surface;

selecting for said die assembly a gap width defined by a distance between said active surface and free end portion; and selecting an encapsulant for at least a portion of said lead frame and said die including a particulate filler material with substantially only particles having a maximum particle diameter providing a ratio of the maximum particle diameter to said gap width of about 0.95 or less.

17. The method of claim 16, wherein said ratio of said maximum particle diameter to said gap width is approximately 0.75.

18. The method of claim 16, wherein said ratio of said maximum particle diameter to said gap width is less than 0.75.

19. The method of claim 16, wherein said filler material possesses a substantially spherical shape.

20. The method of claim 16, wherein said encapsulant includes a particulate filler material with substantially only particles having a maximum particle diameter providing a ratio of the maximum particle diameter to said gap width of about 0.75 or less and having a minimum particle diameter providing a ratio of the minimum particle diameter to said gap width of about 0.25 or greater.

* * * * *

UNITED STATES PATENT AND TRADEMARK OFFICE
CERTIFICATE OF CORRECTION

PATENT NO : 5,759,875
DATED : June 2, 1998
INVENTOR(S) : Syed Sajid Ahmad

It is certified that error appears in the above-identified patent and that said Letters Patent is hereby corrected as shown below:

|  | Column 1 | line 9 | after "assembly" delete the comma. |
|---|---|---|---|
|  | Column 4 | line 8 | after "die" and before the period insert --102--. |
| Claim 11 | Column 8 | lines 42-43 | improper hyphenation of "material". |
| Claim 12 | Column 8 | line 45 | change "p article" to --particle--. |

Signed and Sealed this

Eighteenth Day of January, 2000

Attest:

Q. TODD DICKINSON

*Attesting Officer*    *Commissioner of Patents and Trademarks*